(12) United States Patent
Behrens et al.

(10) Patent No.: US 10,790,776 B2
(45) Date of Patent: Sep. 29, 2020

(54) SYSTEM AND METHOD FOR CONTROLLING THE POWER RATIO OF A SOLAR CONCENTRATOR ARRAY

(71) Applicant: THE BOEING COMPANY, Chicago, IL (US)

(72) Inventors: John W. Behrens, El Segundo, CA (US); Scott B Singer, Sylmar, CA (US); Marc L Breen, Long Beach, CA (US)

(73) Assignee: THE BOEING COMPANY, Chicago, IL (US)

( * ) Notice: Subject to any disclaimer, the term of this patent is extended or adjusted under 35 U.S.C. 154(b) by 135 days.

(21) Appl. No.: 15/012,658

(22) Filed: Feb. 1, 2016

(65) Prior Publication Data

US 2017/0222597 A1 Aug. 3, 2017

(51) Int. Cl.
*H02S 10/40* (2014.01)
*B64G 1/44* (2006.01)
(Continued)

(52) U.S. Cl.
CPC .............. *H02S 10/40* (2014.12); *B64G 1/428* (2013.01); *B64G 1/443* (2013.01);
(Continued)

(58) Field of Classification Search
CPC ......... H02S 10/40; H02S 20/32; B64G 1/443; H01L 31/0547
See application file for complete search history.

(56) References Cited

U.S. PATENT DOCUMENTS 6,988,809 B2 1/2006 Rabinowitz
9,813,022 B2 11/2017 Singer et al.
(Continued)

FOREIGN PATENT DOCUMENTS

CN 101075752 A 11/2007
JP 6591753 B2 10/2019
(Continued)

OTHER PUBLICATIONS

First Office Action and Search Report dated Jul. 3, 2019 issued by the State Intellectual Property Office of P.R.C. in corresponding CN Application No. 201710048978.9, with English translation, 28 pages.
(Continued)

*Primary Examiner* — Bethany L Martin
(74) *Attorney, Agent, or Firm* — Moore Intellectual Property Law, PLLC

(57) ABSTRACT

A system and method for generating electrical power from a solar power supply using at least one concentrator array having a plurality of photovoltaic cells and corresponding reflector groups to direct light to the photovoltaic. A concentration ratio indicative of a portion of the electrical power capacity to generate to power a spacecraft is determined. The concentration ratio is communicated to a control module on the concentrator array. The control module selects a number of reflectors from the total number of reflectors to orient into a photovoltaic energizing position, where the selected number of reflectors corresponds to a concentration ratio of the total number of reflectors.

20 Claims, 12 Drawing Sheets

(51) Int. Cl.
*H01L 31/054* (2014.01)
*H02S 20/32* (2014.01)
*B64G 1/42* (2006.01)
*H02S 20/23* (2014.01)

(52) U.S. Cl.
CPC .......... *H01L 31/0547* (2014.12); *H02S 20/23* (2014.12); *H02S 20/32* (2014.12); *Y02E 10/52* (2013.01)

(56) References Cited

U.S. PATENT DOCUMENTS

| | | | |
|---|---|---|---|
| 10,164,140 | B2 | 12/2018 | Karam et al. |
| 10,236,822 | B2 | 3/2019 | Singer et al. |
| 10,250,182 | B2 | 4/2019 | Singer et al. |
| 2002/0029796 | A1* | 3/2002 | Mikami ............... B64G 1/1085 136/244 |
| 2005/0034751 | A1 | 2/2005 | Gross et al. |
| 2005/0157411 | A1* | 7/2005 | Rabinowitz .......... G02B 26/026 359/851 |
| 2009/0000613 | A1* | 1/2009 | Edwards ................ F24J 2/16 126/684 |
| 2010/0229852 | A1* | 9/2010 | Buckley ................. F24S 50/20 126/652 |
| 2014/0137924 | A1 | 5/2014 | Hollabaugh |
| 2014/0319916 | A1 | 10/2014 | Cummings |
| 2015/0243819 | A1 | 8/2015 | Karam et al. |
| 2015/0244316 | A1 | 8/2015 | Singer et al. |

FOREIGN PATENT DOCUMENTS

| | | |
|---|---|---|
| RU | 2324122 C2 | 5/2008 |
| RU | 2521538 C2 | 6/2014 |
| WO | 2009121174 A1 | 10/2009 |
| WO | 2009152574 A1 | 12/2009 |

OTHER PUBLICATIONS

Second Office Action dated Apr. 7, 2020 issued in corresponding Chinese Application No. 2017100489789, with English translation, 15 pgs.

Office Action and Search Report dated Apr. 21, 2020 issued in corresponding Russian Application No. 2017100584/07 (001011), with English translation, pp. 1-14.

* cited by examiner

SYSTEM AND METHOD FOR CONTROLLING THE POWER RATIO OF A SOLAR CONCENTRATOR ARRAY

BACKGROUND INFORMATION

1. Field

The disclosed systems and methods relate to solar power systems and, more particularly, to systems and methods for controlling the power output of concentrator solar arrays.

2. Background

Electric power generation from solar or photovoltaic cells continues to experience significant interest. Solar cells convert light energy, typically from the Sun, into electrical energy. The light intensity on a solar cell may be referred to as the number of Suns, where a 1-Sun concentration corresponds to standard illumination at 1 kW/m² on Earth.

Currently available concentrator solar power generators employ flat-plate technologies, where photovoltaic cells, referred to as solar cells in solar power conversion applications, are positioned on a two-dimensional array a distance from groups of reflectors, or concentrators. Sunlight reflects off the reflectors and is directed to the solar cells, which convert light energy to electrical energy. The voltage of at each solar cell is collected at a concentrator array voltage output and delivered to a load. The amount of electrical power output from the concentrator array is determined by the efficiency of the solar cells used, and the area and density of the concentrator array. Concentrator arrays may be provided in units having a set number of solar cells and reflector groups and positioned along a plane to form an even larger panel to further increase the power available from a solar array.

More recently developed solar arrays include reflectors available as Micro-Electro-Mechanical Systems (MEMS) reflectors. MEMS reflectors comprise miniaturized mirrors and control components. A single group of MEMs reflectors configured to direct light to a corresponding solar cell may be implemented as a module. Solar cells and the miniaturized MEMS reflectors, or micro-concentrators, may be configured on the concentrator arrays, or micro-concentrator arrays ("MCM") in higher densities than the solar cells and reflectors in typical solar arrays.

Solar cells and reflectors are being used in a variety of applications. One such application is as an electrical power supply on spacecraft. Other applications include terrestrial solar power supplies. One complication with using solar concentrator arrays on spacecraft arises as the spacecraft travels away from the Sun. For missions with destinations that are closer to the sun, the spacecraft begins with the solar concentrator array generating the required power output. As the spacecraft approaches the Sun, the solar concentrator arrays generate excess power due to the increasing intensity of light.

The excess power generated by the solar concentrator arrays in both cases is sufficient to damage spacecraft systems not rated for those power levels or damage/burn out the solar cells themselves. Accordingly, measures are taken in the design of solar concentrator arrays to avoid damage from the excess power raising the cost to build the spacecraft. Components added for such measures also add weight to the structure. The excess available power may also increase temperatures on the panel to a level that may damage the panel itself, for example by melting adhesives used to secure the solar cells to the glass substrate.

There is a need in the art for systems and methods for supplying electrical power to spacecraft that address at least some of the above issues as well as any other possible issues.

SUMMARY

In view of the above, examples of methods and systems for generating electrical power using light concentrator arrays are provided. In one illustrative example, a method is provided for controlling a power output of a concentrator array comprising a plurality of photovoltaic cells and a plurality of reflectors arranged in reflector groups corresponding to the plurality of photovoltaic cells. The method includes receiving a signal to position a selected number of reflectors on the concentrator array into a photovoltaic cell energizing position to generate a power output from the concentrator array. The selected number of reflectors is a concentration ratio of the plurality of reflectors. The selected number of reflectors is positioned into the photovoltaic cell energizing position to generate the power output from the concentrator array.

In another illustrative example, a solar power supply is provided. The solar power supply includes a concentrator array comprising a plurality of solar cells and a plurality of groups of reflectors, each group of reflectors corresponding to one of the solar cells. A power output is connected to each solar cell to receive electrical power generated by each solar cell when light is reflected on to the solar cells from the reflectors. The solar power supply includes a control module having a processor and a non-transitory computer-readable storage medium storing executable instructions that, when executed by the processor, are operative to:

receive a signal to position a selected number of reflectors on the concentrator array into a solar cell energizing position to generate a power output from the concentrator array, where the selected number of reflectors is a concentration ratio of the plurality of reflectors; and position the selected number of reflectors into the solar cell energizing position to generate the power output from the concentrator array.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The novel features believed characteristic of the illustrative examples are set forth in the appended claims. The illustrative examples, however, will best be understood by reference to the following detailed description of an illustrative example of the present disclosure when read in conjunction with the accompanying drawings, wherein:

DETAILED DESCRIPTION

Figure 1A:
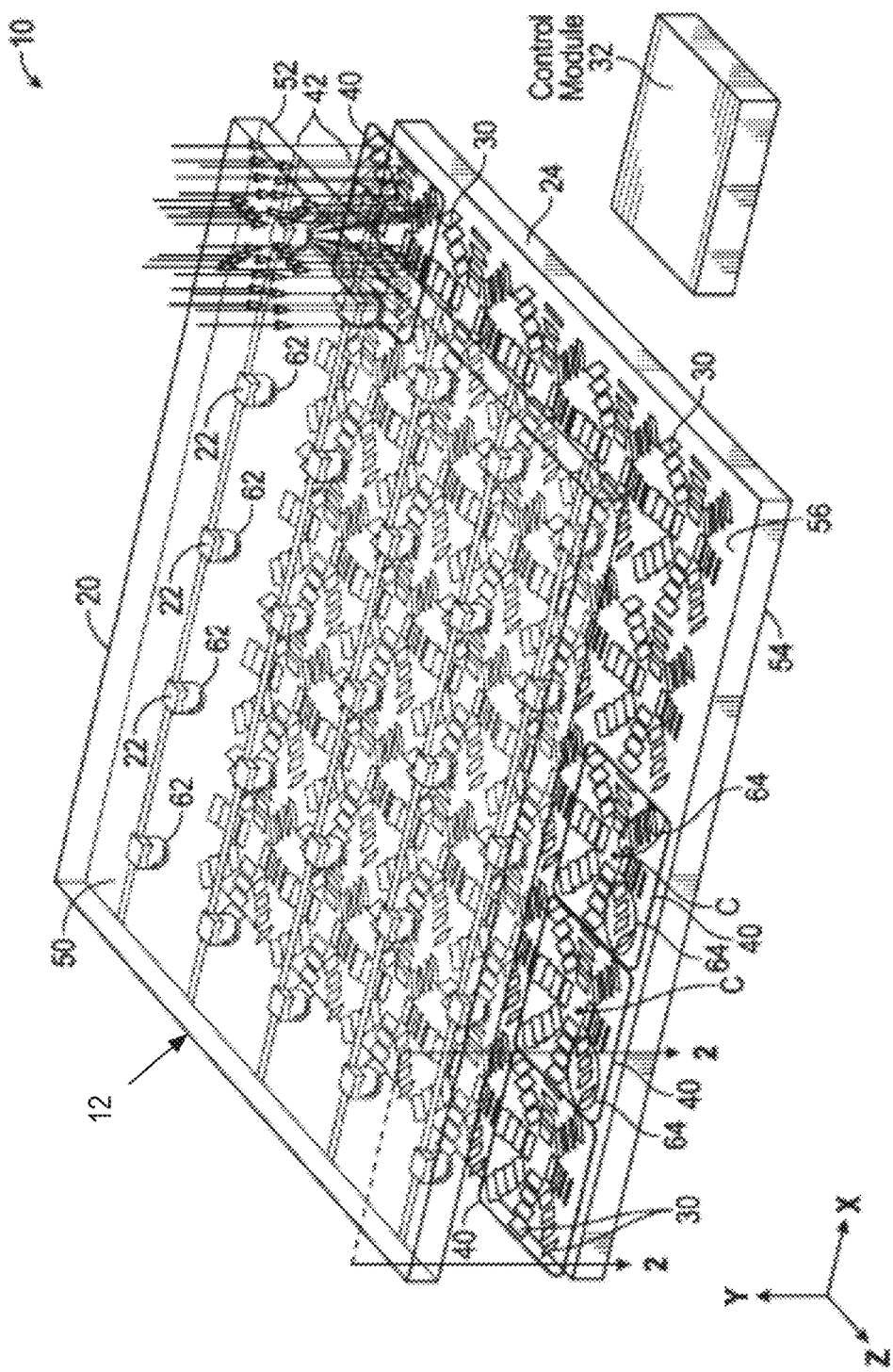
FIG. 1A is a perspective view of an example of a solar concentrator array.

FIG. 1A is a perspective transparent view of an example of a concentrator module 10 for generating electrical power from light. The concentrator module 10 includes a light concentrator array 12, which comprises a cover-glass 20, a plurality of photovoltaic cells 22, a substrate 24, and a plurality of reflectors, or concentrators, 30. The concentrator module 10 also includes a control module 32.

As shown in FIG. 1A, the photovoltaic cells 22 may be arranged in a 5×5 array on the cover-glass 20, which results in a total of twenty-five photovoltaic cells 22 included within the light concentrator array 12. However, those skilled in the art will appreciate that the light concentrator array 12 may include any number of photovoltaic cells 22. The reflectors 30 may be arranged in reflector groups 40 each associated with a corresponding photovoltaic cell 22. Each reflector 30 included within the reflector group 40 may be positioned relative to the associated photovoltaic cell 22 in order to focus or reflect a plurality of light beams 42 generated by a light source (not illustrated) onto the photovoltaic cell 22.

The light source may be any type of radiating energy source such as, for example, man-made lighting in a building, a laser, or the Sun. Each reflector 30 may be selectively tiltable such that if the position of the light source changes, each reflector 30 located within the associated reflector group 40 may be tilted accordingly in order to track the changed position of the light source relative to the associated photovoltaic cell 22. A reflector oriented to direct light towards the photovoltaic cell is in a photovoltaic cell energizing position. The photovoltaic cell energizing position may change and be continuously updated. For example, if the light source is the Sun, then each reflector 30 located within the associated reflector group 40 may be tilted accordingly in order to track the changing position of the Sun throughout the day. A reflector oriented to direct light away from the photovoltaic cell is in a photovoltaic cell non-energizing position.

The concentrator module 10 may be used in any application where light energy may be converted into electrical energy. Examples of implementations described herein relate primarily to the use of concentrator modules in solar power conversion applications. FIG. 1A illustrates a single concentrator module 10 that may be used in relatively compact applications such as, for example, a slim-line pocket-sized portable power generator. However, the single concentrator module 10 may be electrically connected or ganged with other concentrator modules in order to create a two-dimensional or tiled array of multiple concentrator modules (not illustrated) used in larger-scale solar power generators. Such solar power generators may be used in applications such as, for example, a terrestrial portable power generator, an unmanned aerial vehicle (UAV), or a satellite.

The cover-glass 20 may be constructed of any transparent material that allows for the light beams 42 to pass through such as, for example, glass, plastic, or silicon dioxide. The substrate 24 may be used to support or mount the reflectors 30. In one non-limiting aspect, the substrate 24 may be constructed of fused silica.

The control module 32 provides control and telemetry functions for the concentrator module 10. The control module 32 may include processing resources such as a processor and storage capabilities to store data and instructions for performing programmed functions. The control module 32 includes functions for controlling the position and orientation of the reflectors 30 as described in more detail below. In example implementations, the control module 32 may control a number of reflectors 30 or of reflector groups 40 to direct light to their corresponding photovoltaic cells 22 where the number of reflector groups 40 so controlled is a concentration ratio of the total number of reflector groups 40 on the light concentrator array 12. The control module 32 may also include a communications interface for receiving signals or commands from, for example, other computing components such as, for example, a flight computer on a spacecraft.

In the example implementations described below with reference to FIGS. 1B-7, examples of the concentrator module 10 are described in the context of solar power supplies, and more particularly of solar power supplies for use in spacecraft. It is to be understood that the invention is not limited to any particular application or use, or to the precise forms of apparatus or methods. In addition, the description of the concentrator arrays below refers to the photovoltaic cells as solar cells. It is to be understood that the terms "photovoltaic cell" and "solar cell" may be used interchangeably.

Figure 1B:
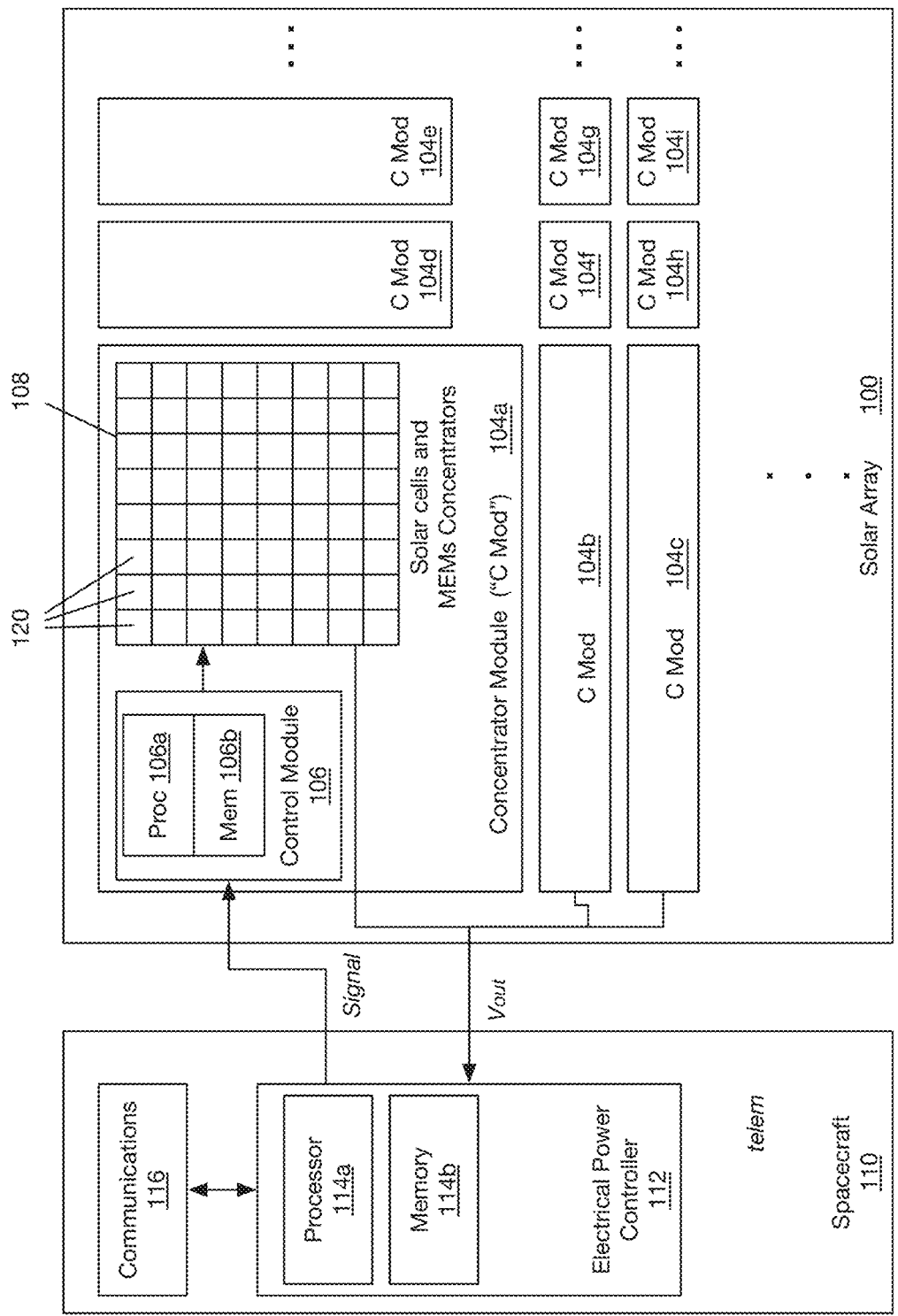
FIG. 1B is a schematic diagram of an example of a solar power supply for providing electrical power to a spacecraft.

FIG. 1B is a schematic diagram of an example of a solar power supply 100 for providing electrical power to a spacecraft 110. The solar concentrator system 100 comprises a plurality of concentrator modules 104a-i arranged to form a flat, two-dimensional panel, which may be referred to as a solar wing. Each of the concentrator modules 104a-i generates a power output from a solar concentrator array 108 in each concentrator module 104a-i. The power outputs of each concentrator module 104a-i are connected to provide a concentrator array power output $V_{out}$, which is used to provide electrical power to the spacecraft 110.

The spacecraft 110 includes an electrical power controller 112, and a communications module 116. The electrical power controller 112 is connected to the concentrator array power output (at $V_{out}$) and is configured to distribute the electrical power from the solar power supply 100 to the various loads in the spacecraft 110. The electrical power controller 112 may also collect data from the solar power supply 100 and from the spacecraft 110 and use the collected data to control the solar power supply 100. The communications module 116 includes a communications interface to radios and antennas to communicate with a ground control system (not shown). The electrical power controller 112 may include a processor 114a and memory resources 114b to execute functions relating to control of the solar power supply 100. For example, the memory resources 114b may include a non-transitory computer-readable medium for storing executable instructions that, when executed by the processor 114a, are operative to perform the functions described herein. Such functions included steps of determining a concentration ratio, and of signaling the concentrator modules 104a-i to position reflectors in a solar cell energizing position according to the concentration ratio. These and other functions are described in more detail below.

In another example implementation, the electrical power controller 112 may communicate with a spacecraft flight computer (not shown) for processing and memory resources. In such an example implementation, the flight computer may use telemetry signals provided by the electrical power controller 112 to signal, or send commands to, the concentrator modules 104 to control the total power output of the solar power supply 100. The flight computer may also provide signaling and commands to the concentrator modules 104.

It is noted that the processor 114a and memory 114b used in performing electrical power control functions are described herein as being components of the electrical power controller 112. This description is not intended to limit the processing resources for performing the described electrical power control functions to processing resources in the electrical power controller 112. As noted above, the spacecraft may include a flight computer, which may be used to perform some or all of the electrical power control functions described herein. It is also noted that the electrical power controller 112 may operate as an independent hardware component comprising its own processing resources and software components, or as a functional component operably connected or integrated within a spacecraft flight computer.

The plurality of concentrator modules 104a-i may be structurally integrated to form the solar wing, or panel, of the solar power supply 100. The plurality of concentrator modules 104a-i have connected power outputs at the concentrator array power output $V_{out}$, which is the total power output of all of the concentrator modules 104a-i in the solar power supply 100. Each concentrator module 104a-i includes a control module 106 and the solar concentrator array 108 as shown in the concentrator module 104a in FIG. 1B.

Each concentrator module 104a-i is configured as described above with reference to FIG. 1A. The concentrator array 108 includes a plurality of solar cell and reflector group units 120 depicted in FIG. 1B as squares in the concentrator array 108. The control module 106 in each concentrator module 104a-i may include a processor 106a, which may be implemented as an ASIC (Application Specific Integrated Circuit) or a FPGA (Field Programmable Gate Array). The control module 106 may also include memory 106b, which includes a non-transitory computer-readable medium storing executable instructions that, when executed by the processor, are operative to perform the functions of the concentrator module 104a-i. Such functions may include for example, controlling a selected number of reflectors in the solar cell energizing position according to a concentration ratio. The control module 106 may include a control interface to the solar cell and reflector group units 120 through which control of the reflectors in the reflector group is performed.

The power output of the solar power supply 100 may be advantageously controlled to generate a desired power output level between a minimum needed to power the spacecraft 110 and a maximum available power output according to a concentration ratio. The concentration ratio may be determined at any given time by determining an available power output and a spacecraft power requirement and adjusting the concentration ratio to ensure the concentrator array power output is not excessive, but sufficient to meet the spacecraft power requirement as illustrated in the description below with reference to FIGS. 4 and 5.

In another example, the concentration ratio may be provided to the control module 106 as a set-point concentration ratio received from a ground control over a ground control communication. Ground control may track the spacecraft location during the mission and determine when the intensity of light from the Sun is affected by the distance of the spacecraft to the Sun to such an extent that the power generated by the solar power supply is either insufficient or excessive (depending on the direction of the spacecraft relative to the Sun). Ground control determines a set-point concentration ratio based on the distance of the spacecraft to the Sun and communicates the set-point concentration ratio to the spacecraft. If the spacecraft is capable of tracking its position relative to the Sun during the mission, the spacecraft may determine a set-point concentration ratio based on its position relative to the Sun. The spacecraft may then set the concentration ratio to the set-point concentration ratio determined by the spacecraft.

The concentration ratio may be defined in terms of a ratio of the total number of reflectors or concentrators used to energize the solar cells. Individual reflectors, or concentrators, may be placed in a solar cell energizing position to direct light to the solar cell, or in a solar cell non-energizing position to direct light away from the solar cell. When a solar cell is energized, the solar cell generates electrical energy depending on the light intensity of the light received by the solar cell. A concentration ratio of the total number of reflectors in the solar cell energizing position may result in all of the solar cells being energized, but only by a number of reflectors less than the total number of reflectors resulting in a power output less than the maximum power output capacity of the concentrator array 108.

In another example, the concentration ratio may be a concentration ratio of reflector groups such that the concentration ratio is defined as a number of solar cells or corresponding reflector groups less than the total number on the solar power supply 100 in which all of the reflectors in those reflector groups are in the solar cell energizing position. All of the reflectors in the remaining reflector groups would be in the solar cell non-energizing position. In another example, the concentration ratio may be defined as a number of the concentrator arrays 108 (assuming all concentrator modules 104a-i comprise concentrator arrays 108 with the same number of solar cells) less than the total number of concentrator arrays 108 in the solar power supply 100.

In yet another example, the concentration ratio may be defined in terms of area. The solar power supply 100 may comprise uniformly distributed concentrator modules 104a-i each having uniformly distributed solar cells and reflector groups 120 so that the solar cells are uniformly distributed on the solar power supply 100. Given such uniform distribution, the concentration ratio may also be defined as a portion of the total area of the panel forming the solar power supply 100. For example, the solar concentrator array 108 may have an area of 30 sq. in. with 30 one square inch solar cells. Each solar cell would provide $1/30^{th}$ of the total power capacity when energized. A concentration ratio of ½ may refer to half the 30 sq. in. concentrator array 108 so that the 15 solar cells encompassed by half of the area of the concentrator array 108 would be energized and the other 15 solar cells would not.

An example of the solar power supply 100 may generate a maximum power capacity of 25 kW with a total of 100 solar cells for a spacecraft that requires 1 kW of power to operate. The concentration ratio may be designated in terms of power output so that a 25:1 concentration ratio corresponds to all reflectors oriented in the solar cell energizing position. The concentration ratio would be set to an initial concentration ratio of 1/25 of the power capacity when the spacecraft is operating at or near Earth. Given this initial concentration ratio, the spacecraft 110 would control the solar power supply to put 1/25 of the total number of reflectors in the solar cell energizing position to generate the 1 kW of electrical power.

The concentration ratio is modified during the mission to ensure the solar power supply 100 generates the required, yet not excessive, power output. For example, a spacecraft that requires 1 kW of power to operate using a solar power supply that generates a maximum of 25 kW would start a mission to Jupiter (at a distance of 5 AU) from Earth (at a distance of 1 AU) with an initial concentration ratio of 1/25. As the spacecraft travels further away from Earth (and the Sun), the light intensity decreases resulting in decreasing power output from the energized solar cells. Therefore, as the spacecraft travels further away from Earth, the concentration ratio is increased recruiting an increasing number of solar cells to generate electrical power. By the time the spacecraft arrives at Jupiter, the concentration ratio is 25:1 energizing all of the available solar cells to generate the required 1 kW to operate the spacecraft.

The solar power supply 100 of a spacecraft with destinations closer to the Sun than Earth may also be controlled using a concentration ratio. For example, a spacecraft on a mission to Venus powered by a solar concentrator array with a maximum capacity of 1 kW on Earth may begin the mission on Earth with all solar cells energized. The concentration ratio may then be decreased as the spacecraft approaches Venus. So as the spacecraft approaches Venus, the number of solar cells energized to power the spacecraft is decreased.

As noted above, the concentration ratio is varied during a mission because the available power output of the solar power supply 100 changes as the spacecraft moves closer or away from the Sun. In an example implementation, the concentration ratio may be determined by the processor 114a and provided to each concentrator module 104a-i by a signal (at Signal in FIG. 1B) from the electrical power controller 112 to each control module 106 of each concentrator module 104a-i. The processor 114a may this way signal the at least one concentrator array. Each concentrator module 104a-i applies the concentration ratio by identifying a selected number of reflectors to orient into the solar cell energizing position, where the selected number of reflectors corresponds to the concentration ratio of reflectors out of the total number of reflectors in each concentrator module 104a-i.

The concentration ratio may also be determined and used by the processor 114a to calculate the number of reflectors in the solar concentrator array 108 to orient into the solar cell energizing position out of the total number of reflectors. The electrical power controller 112 may then signal each control module 106 of each concentrator module 104a-i with the number of reflectors to orient in the solar cell energizing position.

Figure 2A:
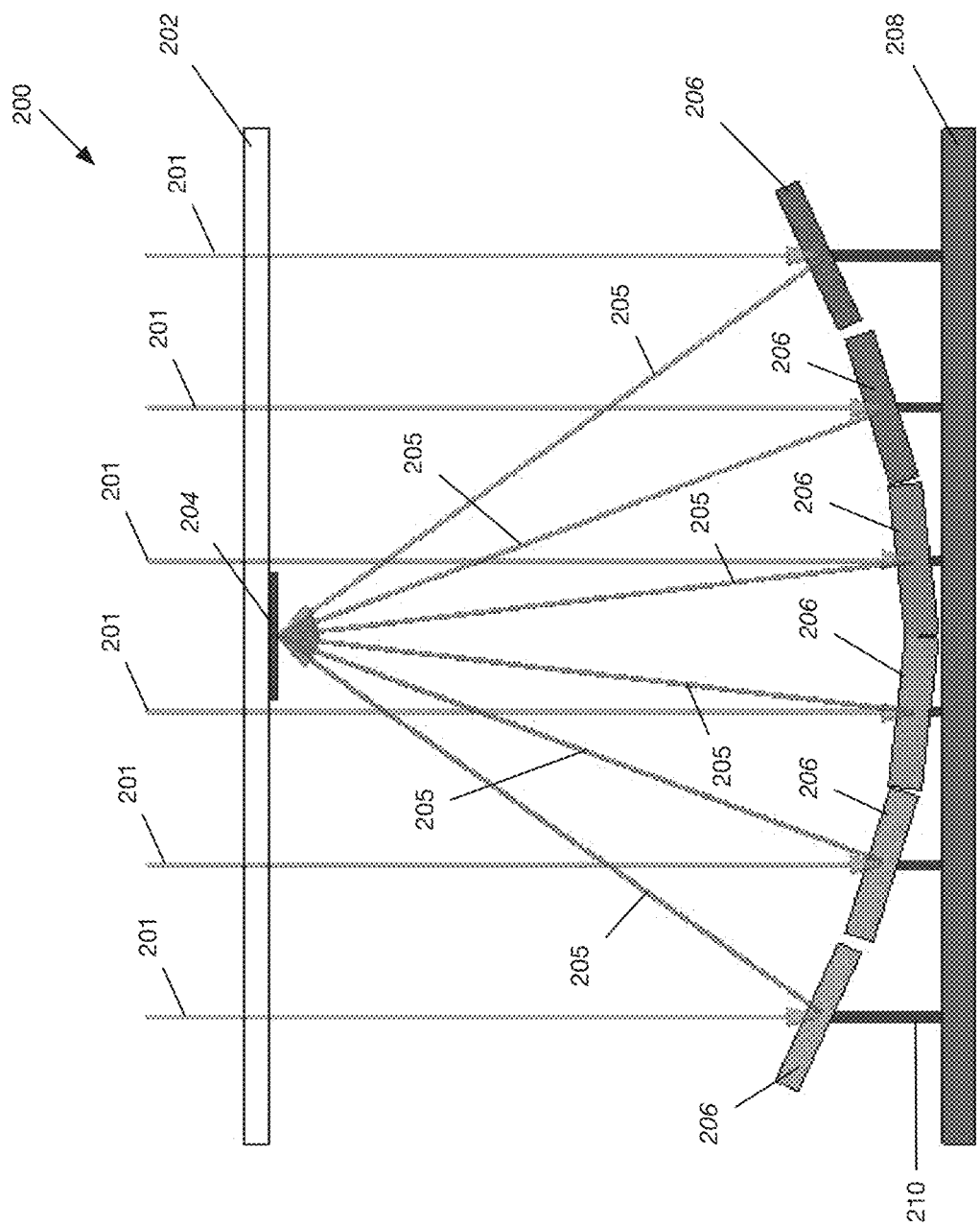
FIG. 2A is a cross-sectional view of an example of a solar cell and corresponding reflectors in a solar cell energizing position.

FIG. 2A is a cross-sectional view of an example of a solar cell and reflector group unit 200 that may be used in the concentrator array 108 in FIG. 1B. The solar cell and reflector group unit 200 in FIG. 2A includes a solar cell 204 mounted on a first planar substrate 202, preferably made of glass, or some other suitable transparent material as described above with reference to FIG. 1A. The corresponding reflector group includes a plurality of reflectors 206 mounted on a second planar substrate 208 spaced apart from, and in parallel with, the first planar substrate 202 so that the solar cell 204 is directly opposite the reflectors 206 in the reflector group. The first and second substrates 202, 208 are oriented so that light 201 is incident to the panel at the first planar substrate 202. While the light 201 is shown in FIG. 2A directed to the first planar substrate 202 at a substantially normal incident angle, the reflectors 206 may be adjusted to maintain light directed at the solar cell 204 when the angle of incidence of the light 201 shifts away from normal as described below with reference to FIG. 2C. The light 201 passes through the clear first planar substrate 201 towards the reflectors 206 in the reflector group. The reflectors 206 direct light 205 back towards the solar cell 204 on the first planar substrate 202.

In the example implementations described herein, the solar cell 204 may be any suitable electronic component that receives light and generates an electrical signal indicative of the light intensity. The corresponding reflectors 206 comprise mirrors arranged to reflect light back towards the solar cell 204. In example implementations, the reflectors 206 may be implemented as Micro-Electro-Mechanical Systems (MEMS) components incorporating miniaturized mirrors and control components to increase the density of solar cell and reflector group units 200 on the concentrator array. Each reflector 206 may be controlled by an actuator 210, which is configured to orient the reflector 206 by rotating the mirror about one or more dimensions. The actuator 210 may also provide translation orientation by moving the reflector closer to, or further away from the solar cell 204. The actuator 210 may receive signals from the control module 106 that move the reflectors 206 as commanded by the control module 106.

By controlling the orientation of each reflector, the control module 106 may control the intensity of light directed to the solar cell corresponding to the reflector. For example, the control module 106 may send signals to each reflector 206 in the reflector group to direct light 205 to the solar cell 204 as shown in FIG. 2A. This position for each reflector 206 in FIG. 2A may be referred to as the solar cell energizing position, which is the position or orientation of the reflector 206 that allows the reflector 206 to direct light to the solar cell 204.

Figure 2B:
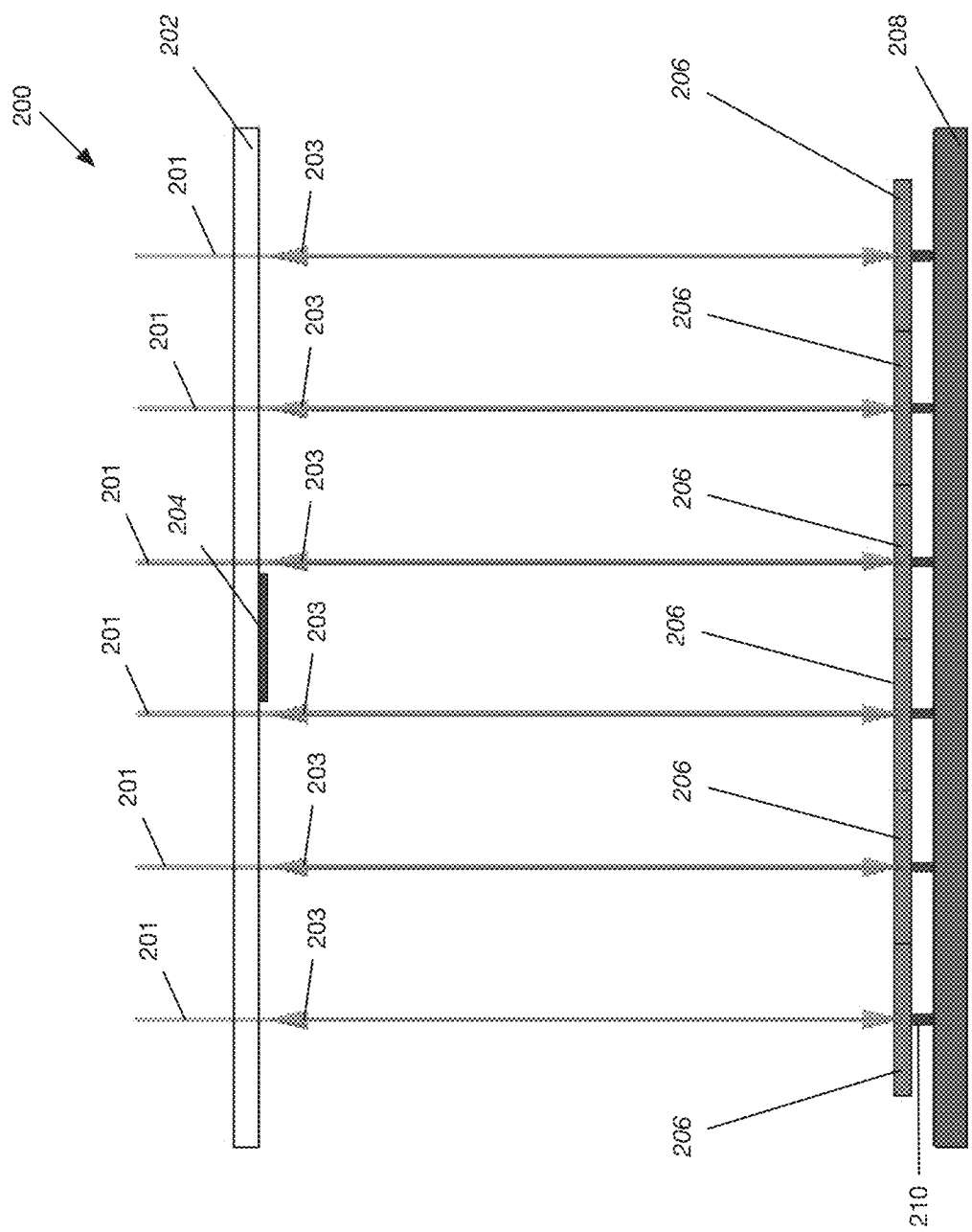
FIG. 2B is a cross-sectional view of an example of a solar cell and corresponding reflectors in the solar cell non-energizing position.

FIG. 2B is a cross-sectional view of the solar cell and reflector group unit 200 with the reflectors 206 oriented in a solar cell non-energizing position. The control module 106 may send signals to the actuators 210 to orient the reflectors 206 to point light 203 in a direction away from the solar cell 204. When the reflectors 206 direct light 203 so that the light 203 does not energize the solar cell 204, the solar cell 204 does not generate an electrical signal and does not contribute to the electrical power output of the concentrator module 104a (in FIG. 1B). The reflectors 206 in FIG. 2B are shown oriented to direct light back along the angle of incidence of the light 201. The solar cell non-energizing position may however be any position or orientation of the reflectors 206 that allow the reflector 206 to direct light in any direction that is not towards the solar cell 204.

As noted above, the concentration ratio may be defined in terms of the number of reflector groups less than the total number of reflector groups having all of the reflectors in the solar cell energizing position. FIGS. 2A and 2B illustrate how the concentration ratio defined in this way may be used to control the power output of the concentrator array 108. If all of the reflectors 206 in each solar cell and reflector group unit 120 are oriented in the solar cell energizing position as shown in FIG. 2A, each solar cell 204 is generating substantially a maximum electrical output corresponding to the incident light intensity. If all of the reflectors 206 in each solar cell and reflector group 120 are oriented in the solar cell non-energizing position as shown in FIG. 2B, there would be effectively no power output from each corresponding solar cell 204. Increasing the concentration ratio increases the number of reflector groups with all reflectors in the solar cell energizing position resulting in a higher power output. Decreasing the concentration ratio decreases the number of reflector groups with all reflectors in the non-solar cell energizing position resulting in a lower power output.

The solar cell energizing position may vary during operation of the spacecraft 110. As noted above, angle of incidence of the light on the cover panel of the solar power supply 100 may vary from substantially 90°. The spacecraft 110 may include hardware and software components that control the orientation and position of the solar power supply 100 to maintain the substantially 90° angle of incidence as the spacecraft 110 travels in space. It may not always be possible for the spacecraft 110 to maintain the 90° angle of incidence of light on the solar power supply 100. If the substantially 90° angle of incidence of light cannot be maintained, the reflectors 206 in the reflector groups energizing the solar cells 204 may be adjusted to maintain a maximum intensity on the energized solar cells 204. In effect, the solar cell energizing position of the reflectors 206 is modified in response to the changes in orientation of the solar power supply 100.

Figure 2C:
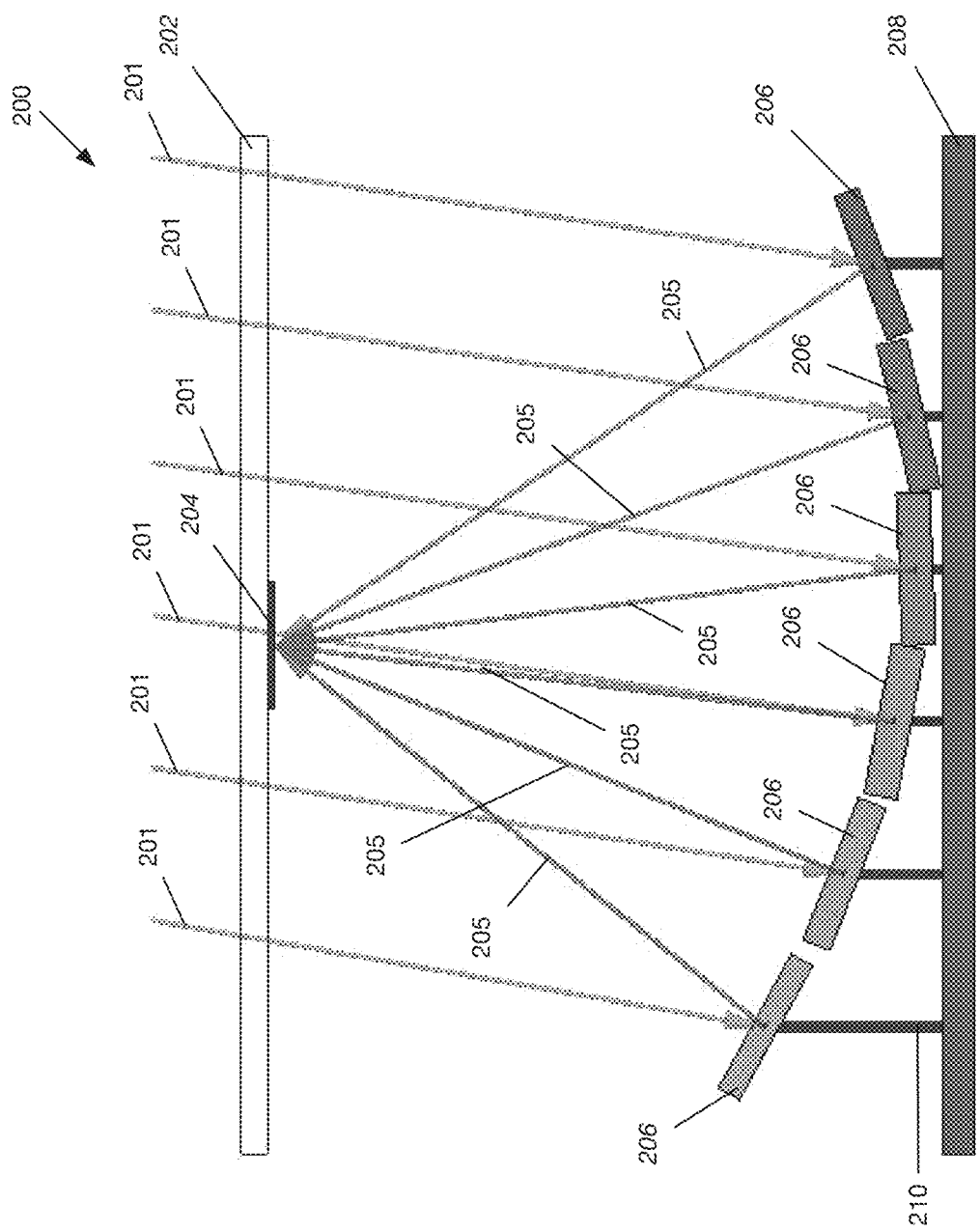
FIG. 2C is a cross-sectional view of an example of a solar cell and corresponding reflectors in a solar cell energizing position when light is not normal to the solar power supply.

FIG. 2C is a cross-sectional view of the solar cell 204 and corresponding reflectors 206 in the solar cell energizing position when light 201 is not normal to the solar power supply 100 (FIG. 1B). The angle of incidence of the light 201 in the example illustrated in FIG. 2C is not substantially 90° unlike the angle of incidence of light 201 shown in the examples in FIGS. 2A and 2B. As the angle of incidence varies away from normal, the control module 106 (in FIG. 1B) controls the reflectors 206 by signaling the actuators 210 to position the reflectors 206 to keep directing light 205 to the solar cell 204. Accordingly, the solar energizing position of the reflectors 206 varies depending on the reflector and on the angle of incidence of light 201.

Figure 2D:
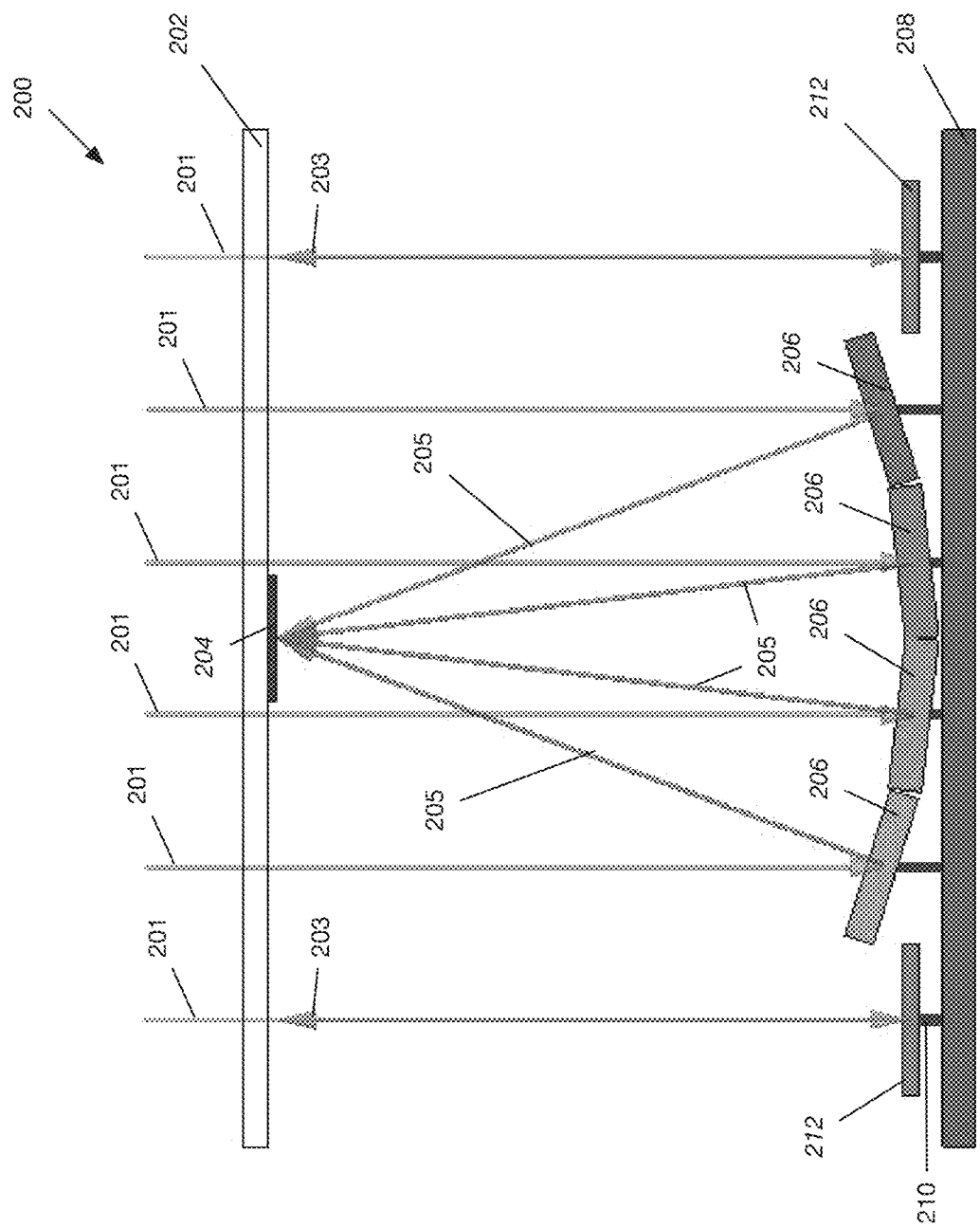
FIG. 2D is a cross-sectional view of an example of a solar cell and corresponding reflectors where selected reflectors are in the solar cell energizing position and other reflectors are in the solar cell non-energizing position.

As noted above, the concentration ratio may be defined in terms of the total number of reflectors in a concentrator array, or in the solar power supply. This may result in applying the concentration ratio to the number of reflectors in a reflector group. FIG. 2D is a cross-sectional view of the example solar cell 204 and corresponding reflectors where, selected reflectors 206 are in the solar cell energizing position and other reflectors 212 are in the solar cell non-energizing position. When the selected number of reflectors 206 oriented into the solar cell energizing position is less than all of the reflectors in the reflector group, the solar cell 204 generates less than the maximum amount of electrical power. Some reflectors 206 in a reflector group would be placed into the solar cell energizing position, and other reflectors 212 in the same reflector group would be placed in the solar cell non-energizing position as shown in FIG. 2D. The total number of selected reflectors 206 placed in the solar cell energizing position in the concentrator array may correspond to the concentration ratio of the total number of reflectors in the concentration array.

The use of the concentration ratio to control the power output of the concentrator array 108 advantageously ensures that the spacecraft power requirements are being met without generating an excessive power level. A spacecraft that requires 1 kW of power traveling from Earth to Jupiter would set an initial concentration ratio to less than the maximum concentration ratio sufficient to generate 1 kW of power, and increase the concentration ratio until the maximum concentration ratio is reached near Jupiter to generate the same 1 kW of power. Similarly, a spacecraft that requires 1 kW of power traveling from Earth to Venus would set an initial concentration ratio to the maximum concentration ratio sufficient to generate 1 kW of power, and decrease the concentration ratio until the minimum concentration ratio needed to generate the same 1 kW of power on Venus is reached.

Figure 3:
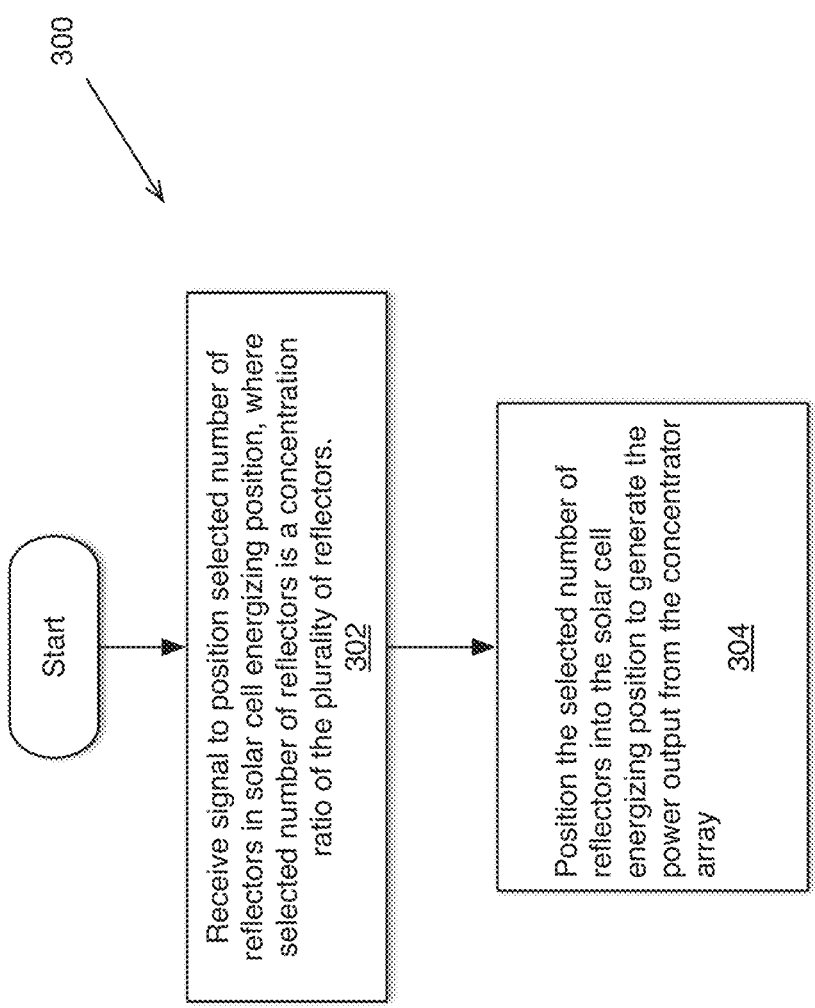
FIG. 3 is a flowchart illustrating operation of an example method for controlling power output from a concentrator array.
Figure 4:
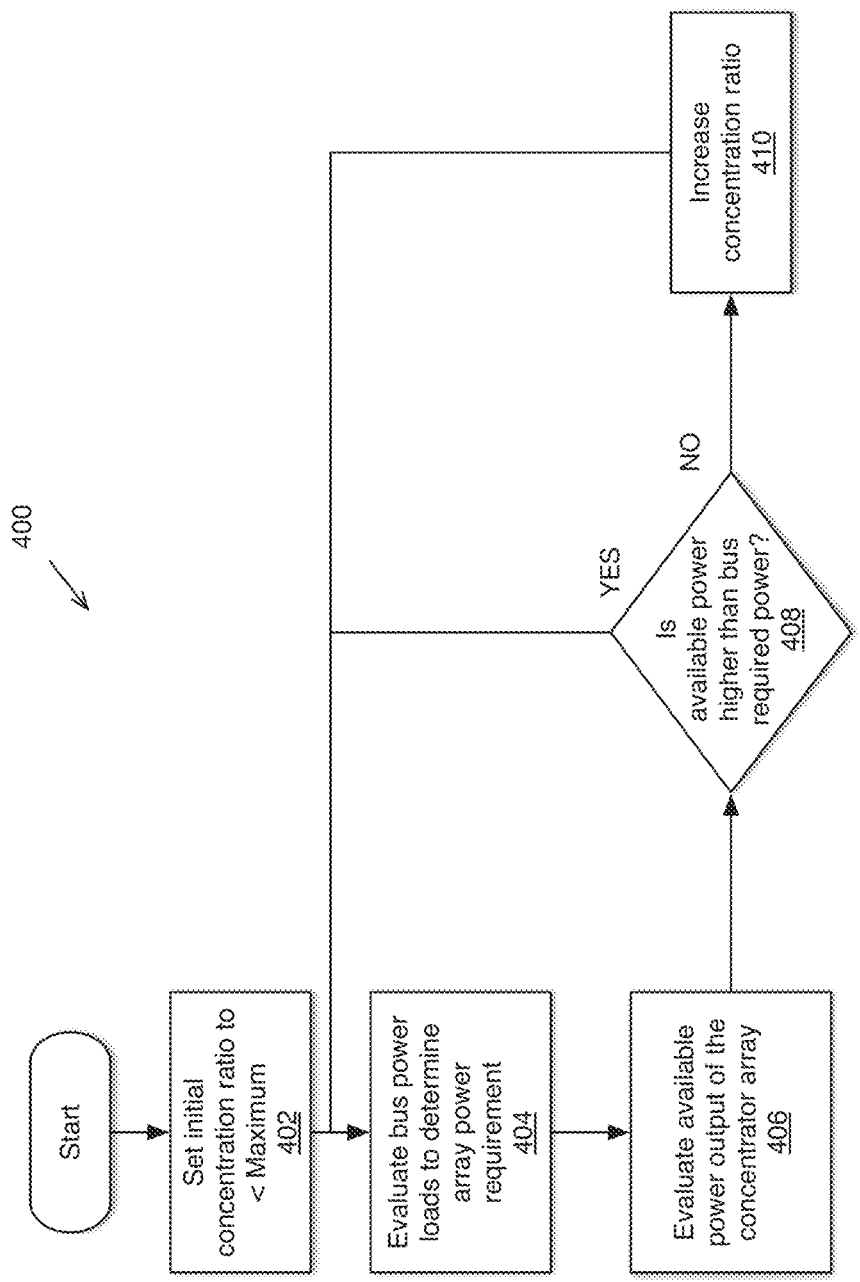
FIG. 4 is a flowchart illustrating operation of an example of a method for varying the concentration ratio for a spacecraft traveling away from the Sun.
Figure 5:
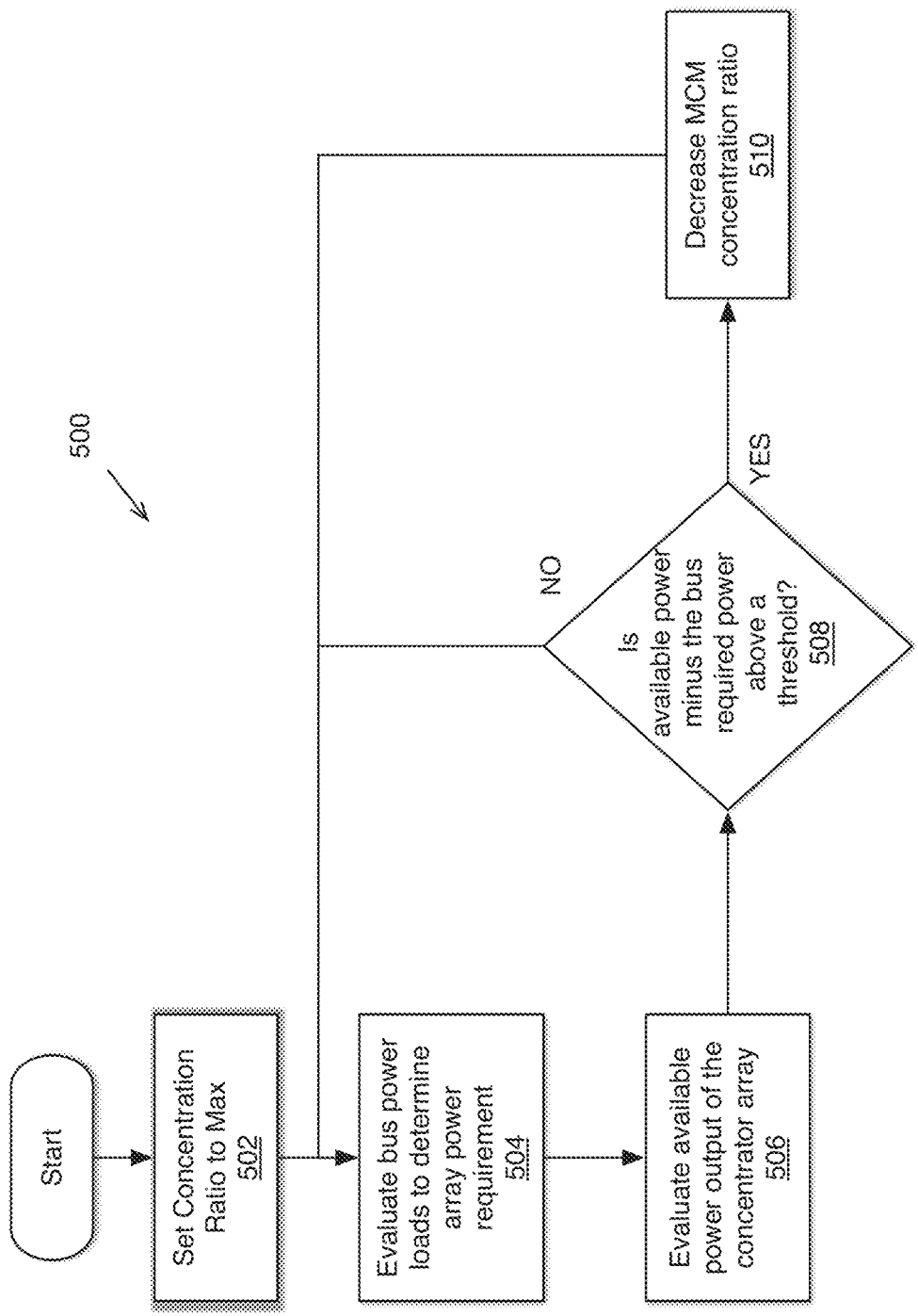
FIG. 5 is a flowchart illustrating operation of an example of a method for varying the concentration ratio for a spacecraft traveling towards the Sun.

FIGS. 3-5 are flowcharts illustrating methods for controlling the power output of a concentrator array using the concentration ratio. It is noted that the methods illustrated in FIGS. 3-5 assume the concentration ratio is based on monitoring the available power output and the spacecraft power requirement. As noted above, the concentration ratio may be determined using other methods such as, without limitation, on the distance to the Sun. In the following description of the methods in FIGS. 3-5, reference is made to components shown in FIG. 1B unless otherwise specified. The methods in FIGS. 3-5 may be implemented as software components comprising computer-implemented instructions stored in memory and executed by a processor in either the control module 106 or in another computing device on the spacecraft 110.

FIG. 3 is a flowchart illustrating operation of a first example method 300 for controlling power output from a concentrator array 108. In the non-limiting example implementation illustrated in FIG. 1B, the electrical power controller 112 determines the concentration ratio and communicates information relating to the concentration ratio (or the concentration ratio itself) to the control module 106. At step 302, the control module 106 receives a signal or command to position a selected number of reflectors in the solar cell energizing position, where the selected number of reflectors is a concentration ratio of the reflectors on the concentrator array 108.

At step 304, the control module 106 positions the selected number of reflectors on the concentrator array 108 into the solar cell energizing position to generate the power output from the concentrator array 108. The control module 106 positions the reflectors by signaling the actuators corresponding to the selected number of reflectors.

As noted above, the concentration ratio may be advantageously adjusted for spacecraft traveling away from the Sun and for spacecraft traveling towards the Sun. FIG. 4 is a flowchart illustrating operation of an example of a method 400 for varying the concentration ratio for a spacecraft traveling away from the Sun. The method 400 in FIG. 4 may be performed by the electrical power controller 112 in order to determine the concentration ratio to signal to the control modules 106 in each concentrator modules 104a-i. In an alternative example, the solar power supply 100 may be implemented using a single concentrator module 104a-i with a control module 106 that performs the operations described herein for the electrical power controller 112.

At step 402, an initial concentration ratio less than a maximum concentration ratio is determined. In the example above for the spacecraft traveling to Jupiter with a spacecraft power requirement of 1 kW and a total maximum power output capacity of 25 kW, the initial concentration ratio may be set to 1/25 to generate the required 1 kW while substantially at Earth. The number of reflector groups corresponding to 1/25 is selected and oriented to the solar cell energizing position. At step 404, the electrical power controller 112 may evaluate bus power loads to determine the spacecraft power requirement. At step 406, the available power output from the concentrator array 108, or arrays, is measured. As noted above, the available power output would decrease as the spacecraft travels further from the Sun due to the decreasing intensity of the light.

At decision block 408, the available power output is compared to the spacecraft power requirement. If the available power output is higher than the spacecraft power requirement (the YES path), the concentration ratio may be left unchanged. If the available power output is less than the spacecraft power requirement (the NO path), the concentration ratio may be increased at step 410. It is noted that a threshold may be applied where the available power should be maintained at the spacecraft power requirement plus a threshold.

Control in the method 400 proceeds from both decision block 408 and step 410 to step 404 to continuously monitor the spacecraft power requirement and then to step 406 to continuously monitor the available power output.

FIG. 5 is a flowchart illustrating operation of an example of a method 500 for varying the concentration ratio for a spacecraft traveling towards the Sun. The method 500 in FIG. 5 may be performed by the electrical power controller 112 to determine the concentration ratio to signal to the control modules 106 in each concentrator modules 104a-i. In an alternative example, the solar power supply 100 may be implemented using a single concentrator module 104a-i with a control module 106 that performs the operations described herein for the electrical power controller 112.

At step 502, an initial concentration ratio greater than a minimum concentration ratio at an initial position is determined. In the example above for the spacecraft traveling to Venus with a power requirement of 1 kW and a total maximum power output capacity of 1 kW, the initial concentration ratio may be set to 10:1 to generate the required 1 kW while substantially at an initial position, which is the Earth. The number of reflector groups corresponding to 10:1, or all of the reflector groups, is selected and oriented to the solar cell energizing position. At step 504, the electrical power controller 112 may evaluate bus power loads to determine the power required from the concentrator array 108. At step 506, the available power from the concentrator array 108, or arrays, is measured. As noted above, the power output would increase as the spacecraft travels towards the Sun due to the increased light intensity as the spacecraft 110 approaches the Sun.

At decision block 508, the available power output is compared to the spacecraft power requirement. If the available power output is less than the spacecraft power requirement (the NO path) plus a threshold, the concentration ratio may be left unchanged. If the available power is above the spacecraft power requirement plus the threshold (the YES path), the concentration ratio may be decreased at step 510. It is noted that the threshold may be a suitable value indicative of a power level that is deemed excessive.

Control in the method 500 proceeds from both decision block 508 and step 510 to step 504 to continuously monitor the spacecraft power requirement and then to step 506 to continuously monitor the available power output.

Figure 6A:
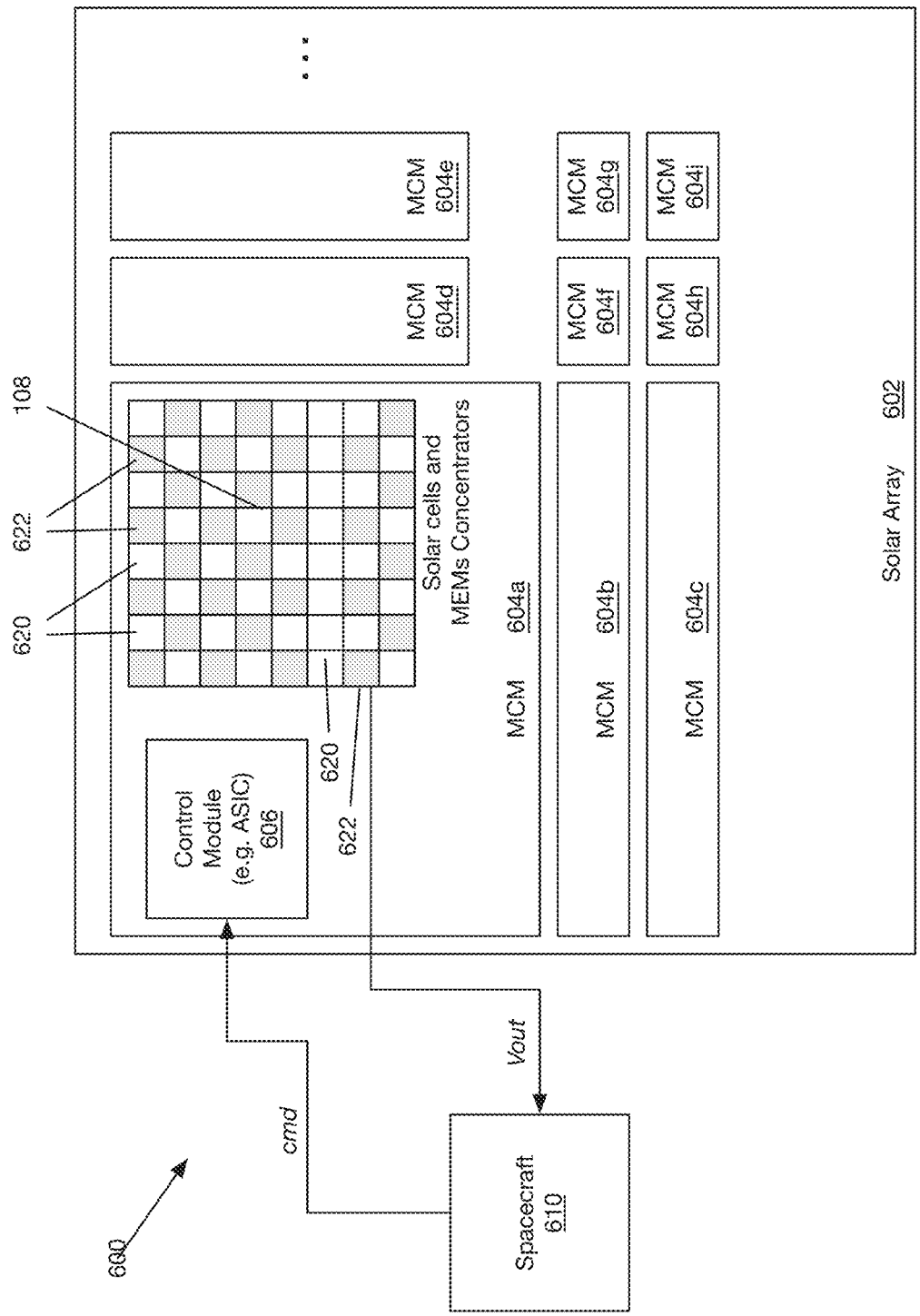
FIG. 6A is a block diagram of an example solar power supply illustrating one example of a method for energizing solar cells using the concentration ratio.

As described above, the concentration ratio may be applied to selected numbers of reflectors individually or in reflector groups. FIG. 6A is a block diagram of an example solar powered space system 600 comprising a spacecraft 610 powered by the solar power supply 602 illustrating energizing reflector groups according to the concentration ratio. The solar power supply 602 includes a plurality of micro-concentrator modules ("MCM") 604a-i, each MCM 604a-i comprising a control module 606 and a micro-concentrator array 608. The micro-concentrator array 608 in FIG. 6A includes solar cells and corresponding MEMS reflector groups. The MCMs 604a-i are examples of the concentrator modules 10 and 104a-i described above with reference to FIGS. 1A and 1B. The micro-concentrator array 608 is an example of the concentrator array 12 and 108 described above with reference to FIGS. 1A and 1B.

The control module 606 in the micro-concentrator array 604a in FIG. 6A may perform the method 300 described above with reference to FIG. 3. The number of reflectors according to the concentration ratio may be selected in reflector groups. In this way, the selected number of reflectors is a concentration ratio of the total number of reflector groups, which is the number of solar cells. All of the reflectors in each of the selected number of reflector groups are oriented into the solar cell energizing position as shown in FIG. 2A. FIG. 6A shows a first set of reflector groups 620 as reflector groups not selected to energize the solar cells corresponding to the first set of reflector groups 620. A second set of reflector groups 622 indicated as grey squares in FIG. 6A is the selected number of reflector groups corresponding to a concentration ratio of ½ selected to energize the solar cells corresponding to each of the second set of reflector groups 622. The example in FIG. 6A illustrates selecting a concentration ratio of solar cells to energize to output the maximum power of each solar cell. The total power output from the micro-concentrator array 604a is a concentration ratio of the total power output capacity of the micro-concentrator array 604a.

Figure 6B:
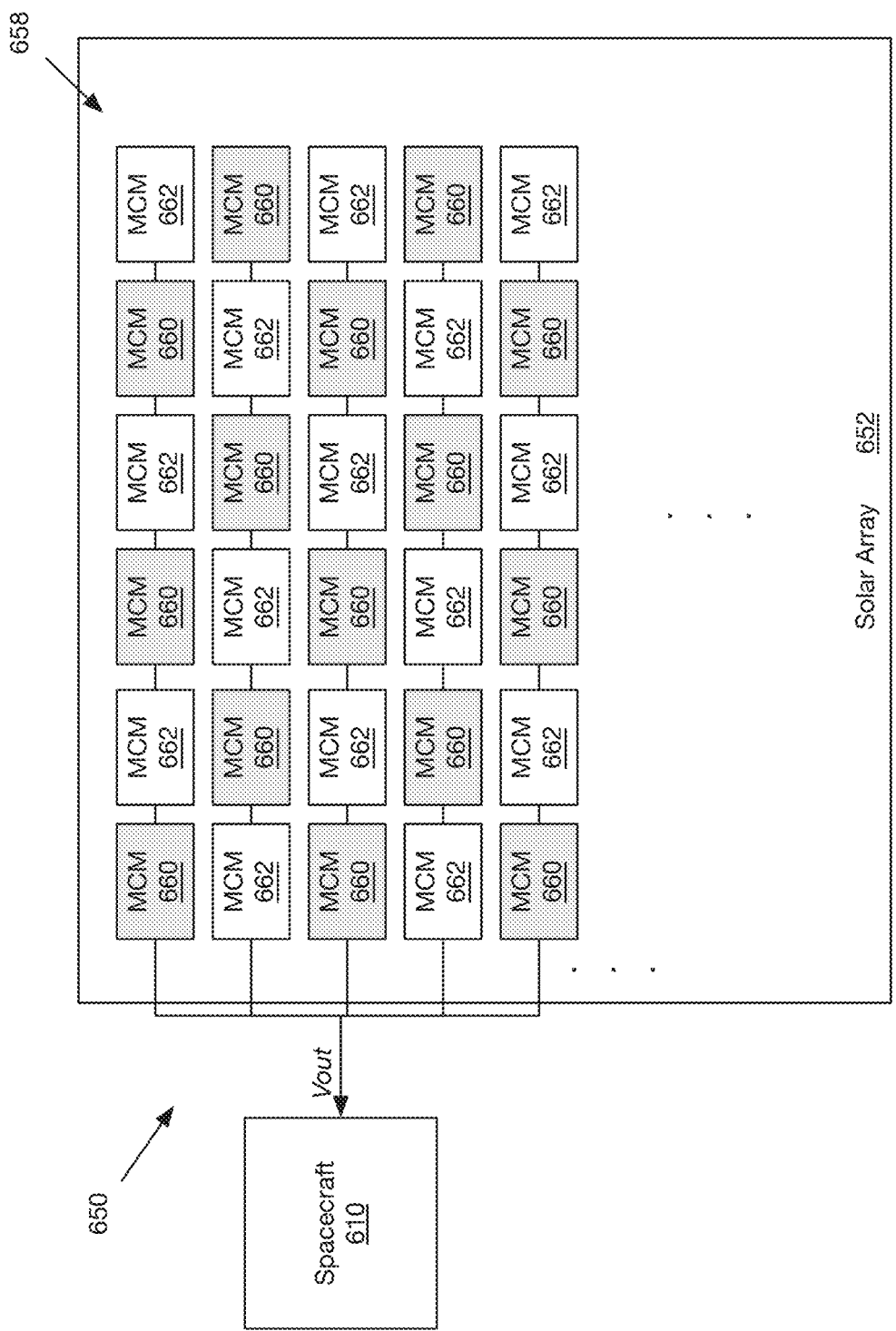
FIG. 6B is a block diagram of an example solar power supply illustrating another example of a method for energizing solar cells using the concentration ratio.

FIG. 6B is a block diagram of an example space system 650 for powering a spacecraft 610 using a solar array 652. The solar array 652 includes a plurality of micro-concentrator modules 660 and 662, each micro-concentrator module 660 and 662 configured as the MCMs 604a-i in FIG. 6A. In the example shown in FIG. 6B, the spacecraft 610 may determine the concentration ratio and select a number of MCMs 658 corresponding to the concentration ratio, and then energize all of the reflector groups on the selected MCMs 658 to orient into the solar cell energizing position. FIG. 6B shows the solar array 652 with a first set of MCMs 660 as grey boxes representing MCMs 660 selected to generate the maximum power output capacity of the MCMs 658. In the first set of MCMs 660, each reflector group corresponding to each solar cell in each micro-concentrator array 608 (in FIG. 6A) in each MCM 660 is oriented to the solar cell energizing position, such as for example, the orientation of the reflectors 206 in FIG. 2A. A second set of MCMs 662 shown as white boxes represent MCMs 662 not selected to generate power. In the second set of MCMs 662, each reflector group corresponding to each solar cell in each micro-concentrator array 608 (in FIG. 6A) in each MCM 662 is oriented to the solar cell non-energizing position, such as for example, the orientation of the reflectors 206 in FIG. 2B.

Figure 7:
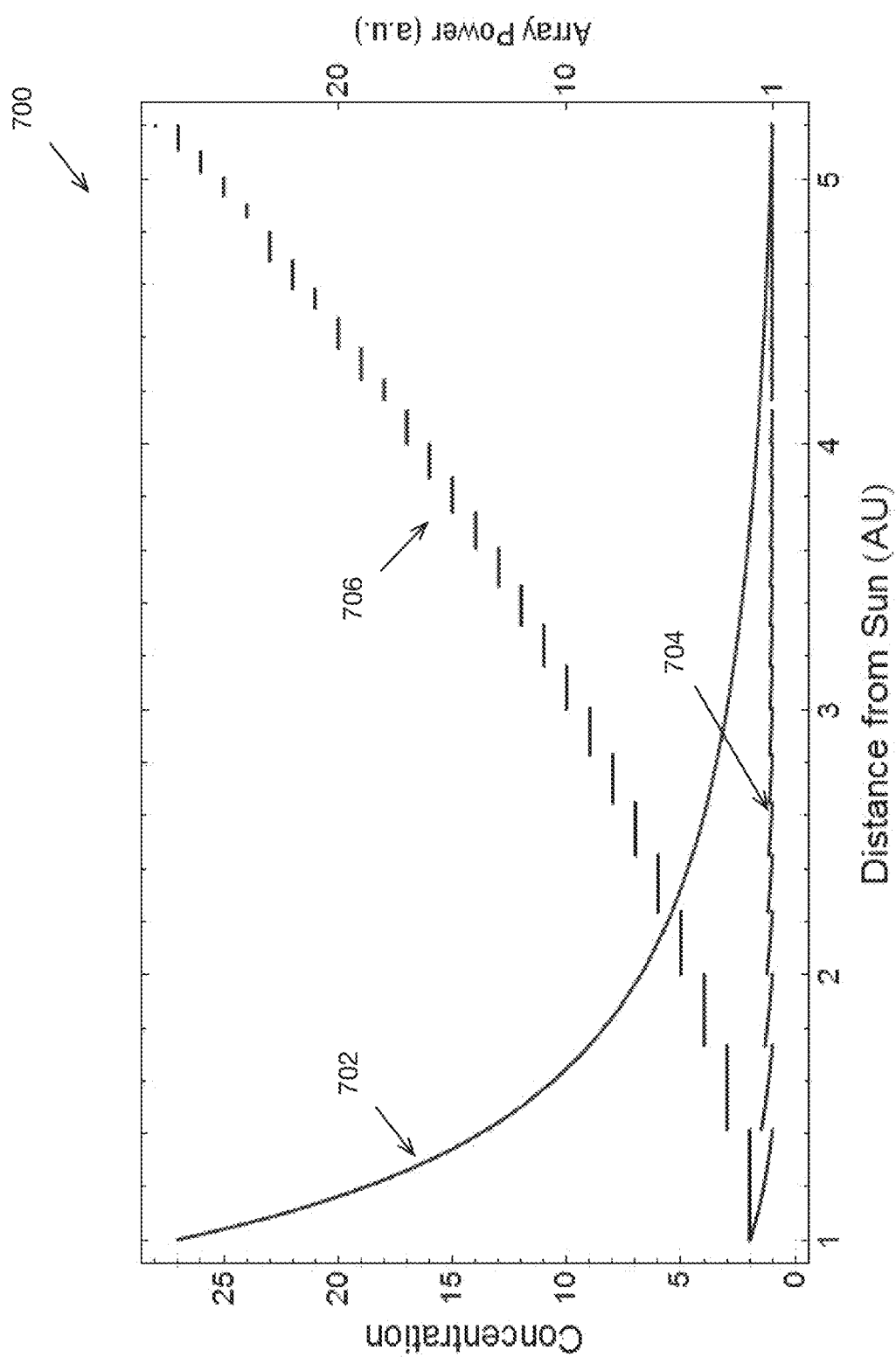
FIG. 7 is a graph illustrating a comparison of the power output from a solar power supply that varies the concentration ratio with the power output with a solar power supply that does not.

FIG. 7 is a graph 700 illustrating a comparison of the power output from an example implementation of the solar power supply 100 in FIG. 1B having solar concentrator arrays 104a-i in which the concentration ratio is varied during the mission and the power output from a typical solar power supply having solar concentrator arrays that do not implement a varying concentration ratio. The graph 700 in FIG. 7 has two vertical axes. The vertical axis on the right ("array power") represents a normalized power output, so that a value of 1 represents the spacecraft power requirement and a value of 20 represents 20× the spacecraft power requirement. The vertical axis on the left ("Concentration") represents the values of concentration ratio that may be used by the example implementation of the solar power supply 100 in FIG. 1B.

The graph 700 shows a first curve 702 representing the power output of the typical solar power supply. The first curve 702 uses the vertical axis on the right ("array power") to show the power output dropping as the distance to the Sun increases. The power output shown by the first curve 702 drops from a power output at an AU of 1 (at Earth) that is about 25× the spacecraft power requirement to the power output of about 1 at Jupiter's 5 AU distance from the Sun. The drop in power output is due to the decreasing intensity of light as the spacecraft travels further away from the Sun.

FIG. 7 shows a second curve 704 representing the power output of the example implementation of the solar power supply 100 in FIG. 1B, which varies the concentration ratio for the concentrator modules 104a-i. The second curve 704 also uses the vertical axis on the right ("array power") to show the power output remaining substantially level during the course of the mission as the spacecraft travels away from the Sun.

FIG. 7 shows the relationship between the concentration ratio and the power output of the example implementation of the solar power supply 100 at a third curve 706. The third curve 706 uses the vertical axis on the left ("Concentration") and shows the increase of the concentration ratio as the spacecraft travels away from the Sun to maintain the power output level as indicated by the second curve 704. As described above, the low concentration ratio at the beginning of the mission results in a portion of reflectors within each MCM oriented in the solar cell energizing position and the remaining reflectors oriented in the solar cell non-energizing. The concentration ratio increases as the spacecraft travels away from the Sun as indicated by the third curve 706. The increase in concentration ratio results in more and more reflectors oriented in the solar cell energizing position during the mission until all of the reflectors are in the solar cell energizing position at about 5 A.U. The power output remains substantially level through the course of the mission.

Example implementations of systems and methods for controlling the power output of concentrator arrays using concentrators to focus light on photovoltaic cells to generate electrical energy. It is noted that individual reflectors in a reflector group may be oriented in the solar cell non-energizing position for functions not relating to the management of electrical power distribution. For example, a spacecraft may be exposed to a sudden burst of light energy sufficient to cause damage to the spacecraft. Such an exposure may be due to a laser attack by an entity intending to destroy the spacecraft, or to a high-intensity burst of light from natural or other un-natural sources.

A sudden burst of destructive light energy may be detected by the spacecraft. For example, during the mission, the electrical power controller 112 may continuously monitor the available power output. While monitoring the available power output, the electrical power controller 112 may sense a spike or a sudden power surge not likely to be caused by light from the Sun incident on the concentrator array 108. The electrical power controller 112 may determine from the spike or sudden power surge that the spacecraft is under a attack from a sudden burst of light energy sufficient to cause damage. In response, the concentrator array 108 may be controlled to orient a selected number of the reflector groups in the solar cell non-energizing position to direct the laser light away from the spacecraft. The selected number may be all of the reflector groups, which would shut electrical power to the spacecraft, or a number sufficient to reflect energy from the laser away from the spacecraft. This response could be programmed autonomously into the control programming or potentially commanded from the ground in advance of a known threat.

An example method is described above for controlling a power output of a concentrator array comprising a plurality of photovoltaic cells and a plurality reflectors arranged in reflector groups corresponding to the plurality of photovoltaic cell, the method comprising:

receiving a signal to position a selected number of reflectors on the concentrator array into a photovoltaic cell energizing position to generate a power output from the concentrator array, where the selected number of reflectors is a concentration ratio of the plurality of reflectors; and positioning the selected number of reflectors into the photovoltaic cell energizing position to generate the power output from the concentrator array.

In an aspect of this example method, each reflector is a micro-electromechanical system (MEMS) device having a miniaturized mirror coupled to an actuator where the step of adjusting each reflector in the selected number of reflectors comprises signaling the actuator to position the miniaturized mirror so that the miniaturized mirror reflects light towards the corresponding photovoltaic cell.

In a further aspect of this example method, the selected number of reflectors are selected in reflector groups where the number of reflector groups comprising the selected number of reflectors corresponds to the concentration ratio of reflector groups such that the step of positioning the selected number of reflectors includes positioning the selected number of reflectors as reflector groups to energize a number of photovoltaic cells corresponding to the concentration ratio.

An example of a solar power supply is described above, the solar power supply comprising a concentrator array comprising a plurality of solar cells and a plurality of groups of reflectors, each group of reflectors corresponding to one of the solar cells;

a power output connected to each solar cell to receive electrical power generated by each solar cell when light is reflected on to the solar cells from the reflectors; and a control module comprising a processor and a non-transitory computer-readable storage medium storing executable instructions that, when executed by the processor, are operative to:

receive a signal to position a selected number of reflectors on the concentrator array into a solar cell energizing position to generate a power output from the concentrator array, where the selected number of reflectors is a concentration ratio of the plurality of reflectors; and position the selected number of reflectors into the solar cell energizing position to generate the power output from the concentrator array.

In an aspect of this example solar power supply, the non-transitory computer-readable storage medium stores executable instructions that, when executed by the processor, are further operative to position the selected number of reflectors as reflector groups to energize a number of solar cells corresponding to the concentration ratio.

Examples of a spacecraft are described above. The spacecraft comprises:
at least one concentrator array comprising a plurality of solar cells and a plurality of groups of reflectors, each group of reflectors corresponding to one of the solar cells, the plurality of solar cells configured to generate a concentrator array power output;
a power output connected to each of the at least one concentrator array to receive the concentrator array power output generated by the solar cells when light is reflected on to the solar cells from the reflectors; and
an electrical power controller connected to receive the power output, and to distribute the concentrator array power output from the at least one concentrator array to the spacecraft, the electrical power controller comprising a processor and a non-transitory computer-readable storage medium storing executable instructions that, when executed by the processor, are operative to:
determine a concentration ratio of the at least one concentrator array;
signal the at least one concentrator array to position a selected number of reflectors into a solar cell energizing position to generate the power output from the corresponding at least one concentrator array, where the selected number of reflectors is based on the concentration ratio.

In one aspect, the spacecraft further comprises a communications module for communicating with a ground control.

In another aspect of the spacecraft, in the electrical power controller, the non-transitory computer-readable storage medium stores executable instructions that, when executed by the processor, are further operative to:
receive a set-point concentration ratio from the ground control via the communication module; and
setting the concentration ratio to the set-point concentration ratio received from ground control in determining the concentration ratio.

In another aspect of the spacecraft, in the electrical power controller, the non-transitory computer-readable storage medium stores executable instructions that, when executed by the processor, are further operative to:
receive a spacecraft location relative to the Sun;
where, as the spacecraft moves away from the Sun, increase the concentration ratio in the step of determining the concentration ratio.

In another aspect of the spacecraft, in the electrical power controller, the non-transitory computer-readable storage medium stores executable instructions that, when executed by the processor, are further operative to:
receive a spacecraft location relative to the Sun;
where, as the spacecraft moves closer to the Sun, decrease the concentration ratio in the step of determining the concentration ratio.

In another aspect of the spacecraft, in the electrical power controller, the non-transitory computer-readable storage medium stores executable instructions that, when executed by the processor, are further operative to:
measure an available power output;
measure a spacecraft power requirement;
determine a difference between the available power output and the spacecraft power requirement; and
base the concentration ratio on the difference between the available power output and the spacecraft power requirement in the step of determining the concentration ratio.

In another aspect, the spacecraft further comprises:
a plurality of concentrator arrays; and
where in the electrical power controller, the non-transitory computer-readable storage medium stores executable instructions that, when executed by the processor, are further operative to:
in signaling the at least one concentrator array:
signal a first selected plurality of the plurality of concentrator arrays to position all of the reflectors on each of the first selected plurality of concentrator arrays to the solar cell energizing position; and
signal a second selected plurality of the plurality of concentrator arrays to position all of the reflectors on each of the second selected plurality of concentrator arrays to a solar cell non-energizing position;
where the number of concentrator arrays in the first selected plurality of concentrator arrays corresponds to the concentration ratio.

An example method is described for generating electrical power for a spacecraft by at least one concentrator module. Each concentrator module comprises a concentrator array having a plurality of solar cells and a plurality reflectors arranged in reflector groups corresponding to the plurality of solar cells. The method comprises:
determining a concentration ratio of the at least one concentrator array;
signaling the at least one concentrator array to position a selected number of reflectors into a solar cell energizing position to generate the power output from the corresponding at least one concentrator array, where the selected number of reflectors is based on the concentration ratio.

In one aspect of this method, the solar power system comprises a plurality of concentrator arrays; and the step of signaling the concentrator arrays comprises:
signaling a first selected plurality of the plurality of concentrator arrays to position all of the reflectors on each of the first selected plurality of concentrator arrays to the solar cell energizing position; and
signaling a second selected plurality of the plurality of concentrator arrays to position all of the reflectors on each of the second selected plurality of concentrator arrays to a solar cell non-energizing position;
where the number of concentrator arrays in the first selected plurality of concentrator arrays corresponds to the concentration ratio.

The flowcharts and block diagrams in the different depicted examples illustrate the architecture, functionality, and operation of some possible implementations of apparatuses and methods in an illustrative example. In this regard, each block in the flowcharts or block diagrams may represent a module, a segment, a function, a portion of an operation or step, some combination thereof.

In some alternative implementations of an illustrative example, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different illustrative examples has been presented for purposes of illustration and description, and is not intended to be exhaustive or limited to the examples in the form disclosed. Many modifications and variations will be apparent to those of ordinary skill in the art. Further, different illustrative examples may provide different features as compared to other desirable examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A method for controlling a power output of a concentrator module from impinging light on the concentrator module, wherein the concentrator module includes a control module having a processor, a plurality of photovoltaic cells, and a plurality of reflectors, the method comprising:
   receiving, at the processor, a signal to change positioning of the plurality of reflectors to generate a power output from the plurality of photovoltaic cells of the concentrator module;
   determining, at the processor, a power usage of a load coupled to the plurality of photovoltaic cells;
   determining, at the processor, a first configuration of the plurality of photovoltaic cells based on the power usage, wherein the first configuration of the plurality of photovoltaic cells identifies a first subset of the plurality of photovoltaic cells to not receive light from a light source and a second subset of the plurality of photovoltaic cells to receive the light from the light source; and
   positioning a portion of the plurality of reflectors to transition the plurality of reflectors into a first configuration of the plurality of reflectors, wherein the first configuration of the plurality of reflectors includes a first subset of the plurality of reflectors positioned in a photovoltaic cell non-energizing position, the first subset of the plurality of reflectors corresponding to the first subset of the plurality of photovoltaic cells, and wherein the first configuration of the plurality of reflectors includes a second subset of the plurality of reflectors positioned in a photovoltaic cell energizing position configured to cause the second subset of the plurality of photovoltaic cells to generate the power output.

2. The method of claim 1, further comprising determining, at the processor, available power from the plurality of photovoltaic cells while the plurality of reflectors are in a second configuration, wherein the plurality of reflectors transition from the second configuration to the first configuration, wherein the first configuration of the plurality of photovoltaic cells is determined further based on the available power, and wherein the first configuration provides less power than the available power provided by the second configuration.

3. The method of claim 1, further comprising receiving, at the processor, a transmission indicating a ratio of powered photovoltaic cells to unpowered photovoltaic cells, wherein the first configuration of the plurality of photovoltaic cells is determined based on the ratio.

4. The method of claim 1, wherein the first configuration of the plurality of photovoltaic cells is determined based on a first distance between the plurality of photovoltaic cells and the light source at a first time, and further comprising:
   determining a second configuration of the plurality of photovoltaic cells based on a second distance between the plurality of photovoltaic cells and the light source at a second time, wherein the second configuration of the plurality of photovoltaic cells identifies a third subset of the plurality of photovoltaic cells to not receive light from the light source and a fourth subset of the plurality of photovoltaic cells to receive the light from the light source; and
   positioning the plurality of reflectors into a second configuration of the plurality of reflectors, wherein the second configuration of the plurality of reflectors includes a third subset of the plurality of reflectors positioned in the photovoltaic cell non-energizing position, the third subset of the plurality of reflectors corresponding to the third subset of the plurality of photovoltaic cells, and wherein the second configuration of the plurality of reflectors includes a fourth subset of the plurality of reflectors positioned in the photovoltaic cell energizing position configured to cause the fourth subset of the plurality of photovoltaic cells to generate the power output.

5. The method of claim 4, wherein the first distance is greater than the second distance, and wherein the first subset of the plurality of photovoltaic cells includes more photovoltaic cells than the third subset of the plurality of photovoltaic cells.

6. The method of claim 4, wherein the second distance is greater than the first distance, and wherein the third subset of the plurality of photovoltaic cells includes more photovoltaic cells than the first subset of the plurality of photovoltaic cells.

7. The method of claim 4, wherein the light source is the Sun, and wherein the plurality of photovoltaic cells is coupled to a spacecraft moving relative to the Sun.

8. The method of claim 1, wherein the plurality of reflectors are in a second configuration while the signal to change positioning of the plurality of reflectors is received, wherein the first configuration is configured to generate less power than the second configuration responsive to a determination that power being generated by the second configuration is greater than the power usage.

9. A method for controlling a power output of a concentrator module from impinging light on the concentrator module, wherein the concentrator module includes a control module having a processor, a plurality of photovoltaic cells, and a plurality of reflectors, the method comprising:
   receiving, at the processor, a signal to change positioning of the plurality of reflectors to generate a power output from the plurality of photovoltaic cells of the concentrator module;
   determining, at the processor, a power usage of a load coupled to the plurality of photovoltaic cells;
   determining, at the processor, a first configuration of the plurality of photovoltaic cells based on the power usage, wherein the first configuration of the plurality of photovoltaic cells identifies a first subset of the plurality of photovoltaic cells to not receive light from a light source and a second subset of the plurality of photovoltaic cells to receive the light from the light source; and
   positioning a portion of the plurality of reflectors to transition the plurality of reflectors into a first configuration of the plurality of reflectors from a second configuration of the plurality of reflectors, wherein the first configuration of the plurality of reflectors includes a first subset of the plurality of reflectors positioned in a photovoltaic cell non-energizing position, the first subset of reflectors corresponding to the first subset of the plurality of photovoltaic cells, wherein the first configuration of the plurality of reflectors includes a second subset of the plurality of reflectors positioned in a photovoltaic cell energizing position configured to cause the second subset of the plurality of photovoltaic cells to generate the power output, wherein the second configuration of the plurality of reflectors includes a third subset of the plurality of reflectors positioned in a photovoltaic cell non-energizing position, wherein the second configuration of the plurality of reflectors includes a fourth subset of the plurality of reflectors positioned in a photovoltaic cell energizing position configured to cause a third subset of the plurality of photovoltaic cells to generate a second power output prior to positioning the portion of the plurality of reflectors, and wherein the third subset of the plurality of photovoltaic cells includes more photovoltaic cells than second subset of the plurality of photovoltaic cells.

10. The method of claim 9, wherein the signal is generated responsive to a change in a distance between the plurality of photovoltaic cells and a light source.

11. The method of claim 10, wherein the light source is the Sun.

12. The method of claim 9, wherein the plurality of reflectors is positioned into the second configuration at a first time, and wherein the plurality of reflectors is positioned into the first configuration at a second time.

13. The method of claim 12, wherein an intensity of light from a light source on the plurality of photovoltaic cells at the first time is less than at the second time.

14. The method of claim 12, wherein the second configuration at the first time produces substantially the same amount of power as the first configuration at the second time.

15. A method for controlling a power output of a concentrator module from impinging light on the concentrator module, wherein the concentrator module includes a control module having a processor, a plurality of photovoltaic cells, and a plurality of reflectors, the method comprising:
receiving, at the processor, a signal to change positioning of the plurality of reflectors to generate a power output from the plurality of photovoltaic cells of the concentrator module;
determining, at the processor, a power usage of a load coupled to the plurality of photovoltaic cells;
determining, at the processor, a first configuration of the plurality of photovoltaic cells based on the power usage, wherein the first configuration of the plurality of photovoltaic cells identifies a first subset of the plurality of photovoltaic cells to not receive light from a light source and a second subset of the plurality of photovoltaic cells to receive the light from the light source; and
positioning a portion of the plurality of reflectors to transition the plurality of reflectors into a first configuration of the plurality of reflectors from a second configuration of the plurality of reflectors, wherein the first configuration of the plurality of reflectors includes a first subset of the plurality of reflectors positioned in a photovoltaic cell non-energizing position, the first subset of the plurality of reflectors corresponding to the first subset of the plurality of photovoltaic cells, wherein the first configuration of the plurality of reflectors includes a second subset of the plurality of reflectors positioned in a photovoltaic cell energizing position configured to cause the second subset of the plurality of photovoltaic cells to generate the power output, wherein the second configuration of the plurality of reflectors includes a third subset of the plurality of reflectors positioned in a photovoltaic cell non-energizing position, wherein the second configuration of the plurality of reflectors includes a fourth subset of the plurality of reflectors positioned in a photovoltaic cell energizing position configured to cause a third subset of the plurality of photovoltaic cells to generate a second power output prior to positioning the portion of the plurality of reflectors, and wherein the third subset of the plurality of photovoltaic cells includes less photovoltaic cells than second subset of the plurality of photovoltaic cells.

16. The method of claim 15, wherein the signal is generated responsive to a change in a distance between the plurality of photovoltaic cells and the sun.

17. The method of claim 16, wherein the light source is the Sun.

18. The method of claim 15, wherein the plurality of reflectors is positioned into the second configuration at a first time, and wherein the plurality of reflectors is positioned into the first configuration at a second time.

19. The method of claim 18, wherein an intensity of light from a light source on the plurality of photovoltaic cells at the first time is greater than at the second time.

20. The method of claim 18, wherein the second configuration at the first time produces substantially the same amount of power as the first configuration at the second time.

* * * * *